United States Patent
Morita et al.

(10) Patent No.: US 7,575,994 B2
(45) Date of Patent: Aug. 18, 2009

(54) SEMICONDUCTOR DEVICE AND MANUFACTURING METHOD OF THE SAME

(75) Inventors: Yuichi Morita, Ora-gun (JP); Shinzo Ishibe, Ora-Gun (JP); Takashi Noma, Ota (JP); Hisao Otsuka, Ora-Gun (JP); Yukihiro Takao, Ota (JP); Hiroshi Kanamori, Tokyo (JP)

(73) Assignee: SANYO Electric Co., Ltd., Osaka (JP)

( * ) Notice: Subject to any disclaimer, the term of this patent is extended or adjusted under 35 U.S.C. 154(b) by 12 days.

(21) Appl. No.: 11/451,633

(22) Filed: Jun. 13, 2006

(65) Prior Publication Data

US 2007/0001302 A1    Jan. 4, 2007

(30) Foreign Application Priority Data

Jun. 15, 2005    (JP)    ............................. 2005-174922

(51) Int. Cl.
    *H01L 21/44*    (2006.01)
(52) U.S. Cl. .................. 438/615; 257/737; 257/750; 257/766; 257/773; 257/E23.132; 438/614; 438/612; 438/613; 438/652; 438/666; 438/678
(58) Field of Classification Search .......... 257/E23.132; 438/958
    See application file for complete search history.

(56) References Cited

U.S. PATENT DOCUMENTS

| 5,656,863 | A | | 8/1997 | Yasunaga et al. |
| 5,918,144 | A | * | 6/1999 | Yanagida .................... 438/615 |
| 5,923,115 | A | * | 7/1999 | Mohr et al. ................. 310/334 |
| 5,946,590 | A | | 8/1999 | Satoh |
| 6,090,468 | A | * | 7/2000 | Shimada et al. ............. 428/137 |
| 6,586,273 | B2 | * | 7/2003 | Aiba et al. .................. 438/106 |
| 6,587,353 | B2 | * | 7/2003 | Sumikawa et al. .......... 361/760 |
| 6,656,828 | B1 | * | 12/2003 | Maitani et al. .............. 438/613 |
| 6,683,583 | B2 | * | 1/2004 | Ngin ........................... 343/897 |
| 6,762,470 | B2 | * | 7/2004 | Siegel et al. ................. 257/414 |

(Continued)

FOREIGN PATENT DOCUMENTS

JP    57-39560    3/1982

(Continued)

OTHER PUBLICATIONS

European Search Report mailed on Aug. 5, 2008 directed towards counterpart foreign application No. 06012323.9; 6 pages.

*Primary Examiner*—Minh-Loan T Tran
*Assistant Examiner*—Fei Fei Yeung Lopez
(74) *Attorney, Agent, or Firm*—Morrison and Foerster LLP

(57) ABSTRACT

The invention provides a CSP type semiconductor device with high reliability. The semiconductor device includes a pad electrode formed on a semiconductor substrate, a first passivation film covering an end portion of the pad electrode and having a first opening on the pad electrode, a plating layer formed on the pad electrode in the first opening, a second passivation film covering an exposed portion of the pad electrode between an end portion of the first passivation film and the plating layer, covering an end portion of the plating layer, and having a second opening on the plating layer, and a conductive terminal formed on the plating layer in the second opening.

4 Claims, 5 Drawing Sheets

U.S. PATENT DOCUMENTS

| | | |
|---|---|---|
| 6,908,311 B2 | 6/2005 | Ono et al. |
| 2004/0130602 A1* | 7/2004 | Watanabe .................... 347/68 |
| 2005/0017356 A1 | 1/2005 | Ohsumi |
| 2005/0070084 A1* | 3/2005 | Hsu et al. ................... 438/612 |

FOREIGN PATENT DOCUMENTS

| | | |
|---|---|---|
| JP | 09-046027 | 2/1997 |
| JP | 2000-299406 | 10/2000 |

* cited by examiner

SEMICONDUCTOR DEVICE AND MANUFACTURING METHOD OF THE SAME

CROSS-REFERENCE OF THE INVENTION

This application is based on Japanese Patent Application No. 2005-174922, the content of which is incorporated herein by reference in its entirety.

BACKGROUND OF THE INVENTION

1. Field of the Invention

The invention relates to a CSP type semiconductor device with high reliability and a manufacturing method thereof.

2. Description of the Related Art

CSP (Chip Size Package) has received attention as a new packaging technology in recent years. The CSP means a small package having almost the same outside dimensions as those of a semiconductor die packaged in it.

Conventionally, a BGA (Ball Grid Array) type semiconductor device has been known as a kind of CSP. Ball-shaped conductive terminals are provided in this BGA type semiconductor device, being electrically connected with pad electrodes on a semiconductor substrate.

When this BGA type semiconductor device is mounted on electronic equipment, a semiconductor die is electrically connected with an external circuit on a printed circuit board by compression bonding of the conductive terminals to wiring patterns on the printed circuit board.

Such a BGA type electronic device has advantages in providing a large number of conductive terminals and in reducing size over other CSP type semiconductor devices such as SOP (Small Outline Package) and QFP (Quad Flat Package), which have lead pins protruding from their sides. Therefore, the BGA type electronic device is broadly used as an image sensor chip for a digital camera incorporated into a mobile telephone or the like, for example.

Hereafter, the conventional BGA type semiconductor device will be described using figures (FIGS. 7 to 10). FIGS. 7 to 10 show cross-sectional views in process order.

First, a silicon oxide film 101 and an interlayer insulation film 102 (a polyimide type resin film, a PSG film, or the like) are formed on a semiconductor substrate 100 made of silicon (Si) or the like as shown in FIG. 7.

A metal layer (aluminum layer) is then formed on the interlayer insulation film 102 and patterned using a mask (not shown) to form a pad electrode 103 on the interlayer insulation film 102.

Next, a passivation film 104 made of solder resist or the like is formed on the front side of the semiconductor substrate 100 including on the pad electrode 103, and exposure and development are performed to the passivation film 104, thereby forming an opening 105 exposing a predetermined surface of the pad electrode 103 as shown in FIG. 8.

Then, a plating layer 106 having a layered structure of nickel (Ni) and gold (Au) is formed on the pad electrode 103 exposed in the opening 105 by an electrolytic plating method or an electroless plating method as shown in FIG. 9.

A portion near an end portion of the pad electrode 103 is not covered with the plating layer 106, leaving an exposed portion 107. There can be various causes of the formation of this exposed portion 107. One example is that residues of the passivation film 104 are easy to remain on its sidewall (patterned surface) when the opening 105 is formed due to filler (additive) or the like added to the passivation film 104 for preventing the passivation film 104 from warping, and the residue makes the sidewall uneven, so that the plating layer 106 does not adhere to the sidewall enough. It is noted that the exposed portion 107 means a portion exposing the pad electrode 103 between the passivation film 104 and the plating layer 106.

Next, a solder ball is fixed to a predetermined region of the plating layer 106 by an electrolytic plating method or an electroless plating method, thereby forming a conductive terminal 108 as shown in FIG. 10.

It is possible to form the conductive terminal 108 by screen-printing solder and reflowing the solder by a heat treatment (solder bump).

The relevant technology is disclosed in Japanese Patent Application Publication No. 2000-299406.

In the described conventional BGA type semiconductor device, however, a substance such as moisture, chemicals, a corrosive gas, metal ions, or the like that causes corrosion infiltrates through the exposed portion 107 to corrode the pad electrode 103 and reduces the reliability of the semiconductor device.

SUMMARY OF THE INVENTION

The invention provides a semiconductor device that includes a semiconductor substrate, a pad electrode disposed on the substrate, a first passivation film disposed on the substrate and having a first opening above the pad electrode so that an edge portion of the pad electrode is covered by the first passivation film, a plating layer disposed on the pad electrode in the first opening, and a second passivation film disposed on the plating layer and the first passivation film and having a second opening above the plating layer. The second passivation film fills a gap between an edge portion of the plating layer and an edge portion of the first passivation film. The device also includes a conductive terminal disposed on the plating layer in the second opening.

The invention also provides a method of manufacturing a semiconductor device. The method includes providing a semiconductor substrate having a pad electrode thereon, forming on the substrate a first passivation film covering an edge portion of the pad electrode so as to form a first opening above the pad electrode, forming a plating layer on the pad electrode in the first opening, forming a second passivation film on the plating layer and the first passivation film so as to form a second opening above the plating layer and to fill a gap between an edge portion of the plating layer and an edge portion of the first passivation film and forming a conductive terminal on the plating layer in the second opening.

DETAILED DESCRIPTION OF THE INVENTION

Figure 5:
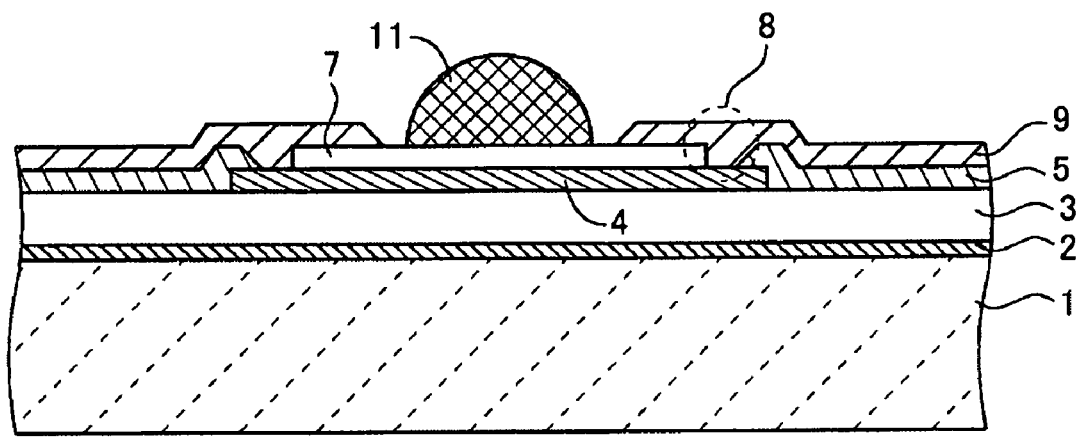
Figure 6:
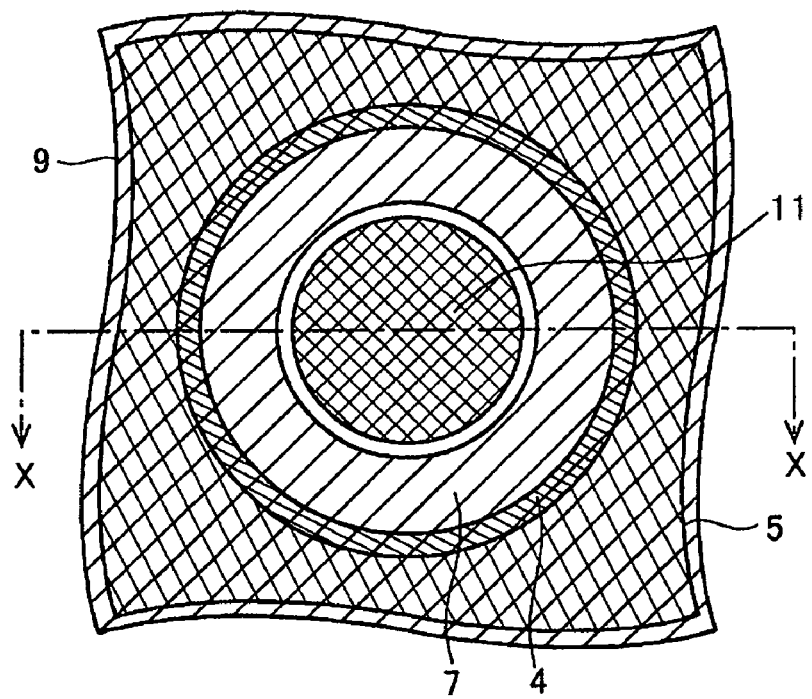
FIG. 6 is a plan view for explaining a semiconductor device of the embodiment and its manufacturing method.
Figure 7:
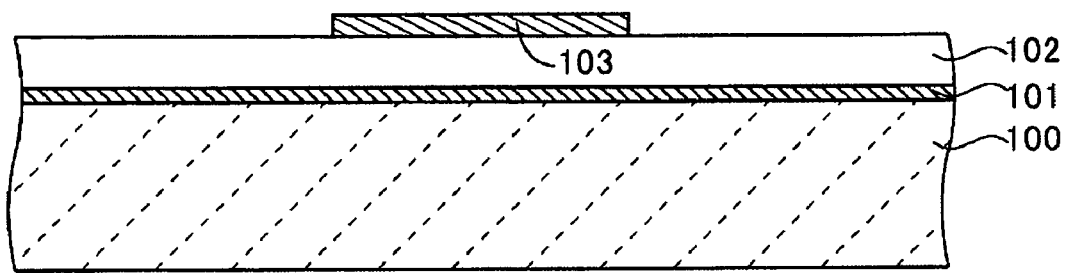
FIGS. 7 to 10 are cross-sectional views for explaining a semiconductor device of a conventional art and its manufacturing method.
Figure 8:
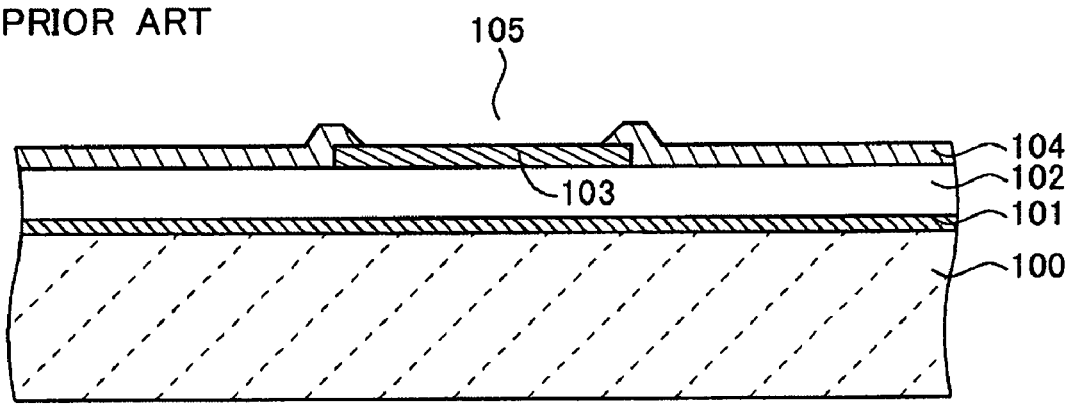
Figure 9:
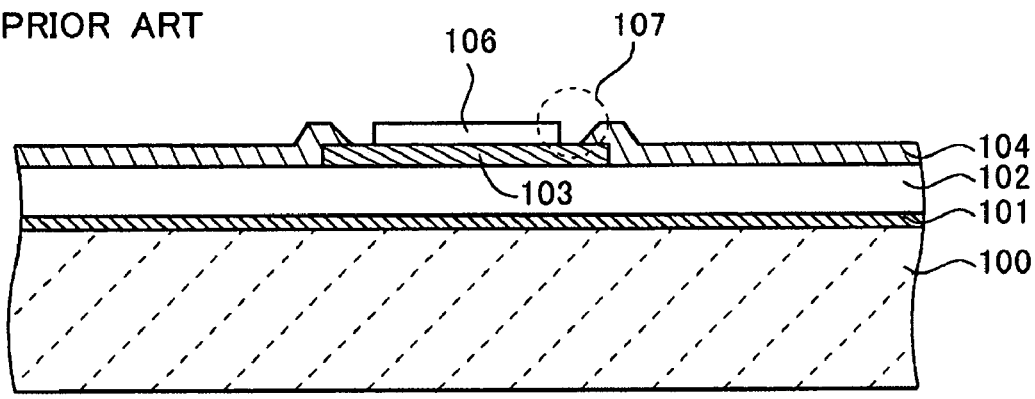
Figure 10:
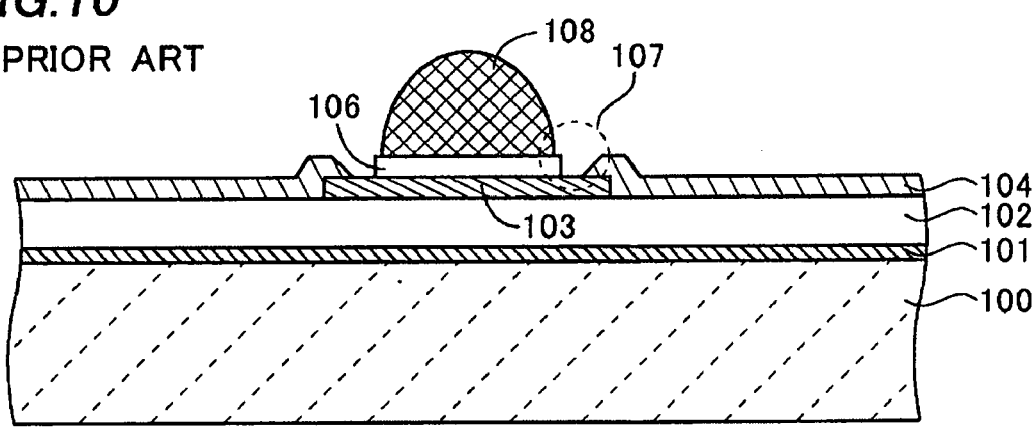

An embodiment of the invention will be described in detail referring to figures. FIGS. 1 to 5 are cross-sectional views of a semiconductor device of the embodiment shown in process order. FIG. 6 is a plan view of the semiconductor device of the embodiment, and FIG. 5 is a cross-sectional view of FIG. 6 along line X-X. Although a MOS transistor, a plurality of wirings, an element connecting the wirings such as a plug, and an element separation film made of a silicon oxide film are formed on a semiconductor substrate as appropriate, these are not shown in the figures.

Figure 1:
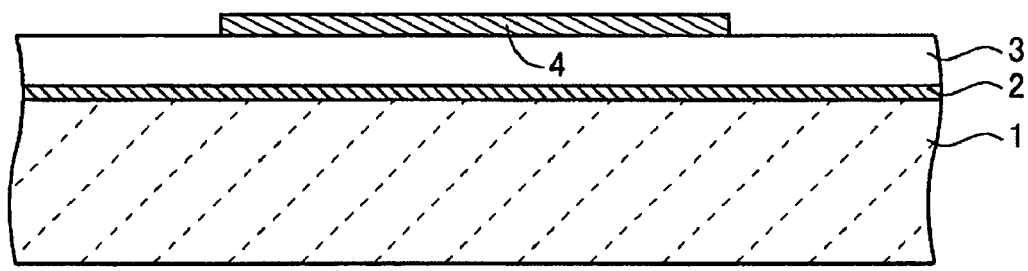
FIGS. 1 to 5 are cross-sectional views for explaining a semiconductor device of an embodiment of the invention and its manufacturing method.

First, an insulation film 2 (e.g. a silicon oxide film formed by a thermal oxidation method or a CVD method) is formed on a semiconductor substrate 1 made of silicon (Si) or the like to have a film thickness of, for example, 2 μm as shown in FIG. 1. An interlayer insulation film 3 (an organic film such as a polyimide type resin film) is formed on the insulation film 2 to have a film thickness of, for example, 10 μm by a coating method (by a spin coating method or a spray coating method).

Although the interlayer insulation film 3 is formed for securing a withstand voltage in this embodiment, it is possible to form a structure without the interlayer insulation film 3 in particular. The interlayer insulation film 3 can be made of a silicon oxide film, a silicon nitride film, a PSG film, a BPSG film, or the other insulation film by a CVD method or the like.

Next, a metal layer made of aluminum (Al), copper (Cu), or the like that is to be a pad electrode 4 is formed by a CVD method, a sputtering method, or the other deposition method, and then the metal layer is patterned using a mask (not shown), thereby forming the pad electrode 4 having a film thickness of, for example, 1 μm on the interlayer insulation film 3. The pad electrode 4 is an external connection pad connected with an input circuit or an output circuit (not shown) on the semiconductor substrate. The pad electrode 4 of the embodiment is formed to have the outside dimensions that are 1.1 to 1.2 times larger than the outside dimensions of the conventional pad electrode 103. It is needless to say that the outside dimensions of the pad electrode 4 can be increased within an acceptable range for a chip die.

Figure 2:
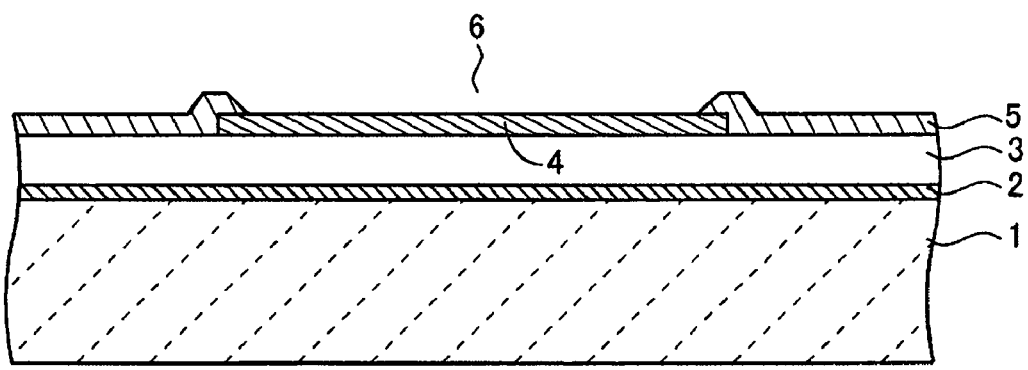

Next, a first passivation film 5 that covers the surface of the interlayer insulation film 3 and an end portion of the pad electrode 4 and has an opening 6 on the pad electrode 4 is formed to have a thickness of, for example, 10 μm as shown in FIG. 2. This first passivation film 5 is formed by coating an organic material such as a polyimide type resin film or a solder resist film on the interlayer insulation film 3 and the pad electrode 4 by a coating method and performing a heat treatment (pre-bake) thereto. It is possible to add filler (additive) to the first passivation film 5 for preventing the film from warping.

Then, exposure and development are performed to the coated organic material to form the opening 6 exposing a predetermined surface of the pad electrode 4, and a heat treatment (post-bake) is performed thereto. This first passivation film 5 and a second passivation film 9 that will be described below stabilize the surface of the semiconductor substrate 1 and function as protection films protecting the pad electrode 4 from corroding or the like.

Figure 3:
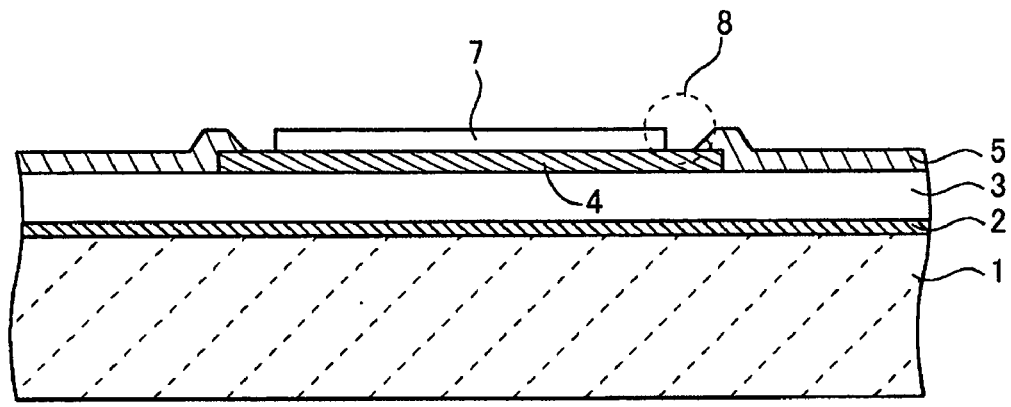

Next, a plating layer 7 is formed on the pad electrode 4 exposed in the opening 6 by layering a nickel (Ni) layer mainly made of nickel and a gold (Au) layer mainly made of gold in this order (a lower layer=a nickel layer, an upper layer=a gold layer) by an electrolytic plating method or an electroless plating method using the first passivation film 5 as a mask as shown in FIG. 3. A portion near the end portion of the pad electrode 4 is not covered with the plating layer 7, leaving an exposed portion 8.

Figure 4:
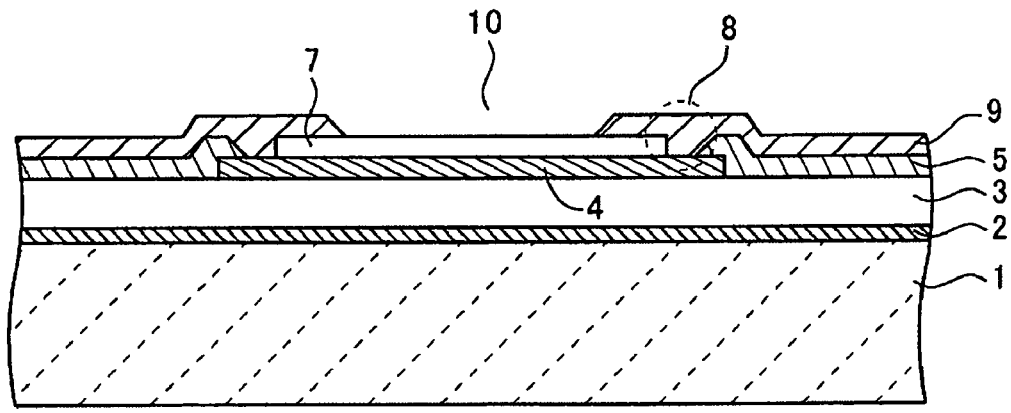

Next, a second passivation film 9 (a repair passivation film) made of an organic material such as a polyimide type resin film or a solder resist film is formed on the semiconductor substrate 1 by a coating method to have a thickness of, for example, 10 μm as shown in FIG. 4. This second passivation film 9 covers the exposed portion 8 and further the end portion of the plating layer 7, and has an opening 10 on the plating layer 7.

This second passivation film 9 is formed by coating an organic material such as a polyimide type resin film or a solder resist film on the first passivation film 5 and the plating layer 7 by a coating method and performing a heat treatment (pre-bake) thereto in the same manner as the method of forming the first passivation film 5. Then, exposure and development are performed to the coated organic material to form an opening 10 exposing a predetermined surface of the plating layer 7, and then a heat treatment (post-bake) is performed thereto.

Next, a solder ball is fixed to a predetermined region of the plating layer 7 in the opening 10 by an electrolytic plating method using the plating layer 7 as a plating electrode to form a conductive terminal 11 as shown in FIGS. 5 and 6.

An advantage of forming a solder ball as the conductive terminal 11 is to facilitate its formation. The height of the conductive terminal 11 is 100 μm, for example.

It is possible to form the conductive terminal 11 by screen-printing solder and reflowing this solder by a heat treatment (solder bump). An advantage of forming a solder bump as the conductive terminal 11 is to form a fine shaped terminal with high accuracy. The conductive terminal 11 can be made of gold and its material is not particularly limited.

With the described structure, since the passivation films are formed in two steps, the plating layer 7 is formed in the larger region than conventional, and the end portion of the plating layer 7 is covered with the second passivation film 9. The exposed portion 8 of the pad electrode 4 is also covered with the second passivation film 9. Therefore, the pad electrode 4 is prevented from corroding, and the reliability of the semiconductor device can be enhanced.

Furthermore, since the plating layer 7 is formed in the larger region than conventional, even if a space occurs between the second passivation film 9 and the conductive terminal 11, the distance between the space and the exposed portion 8 of the pad electrode 4 is long and thus the resistance to corrosion becomes high.

As described above, although there can be various causes of the formation of the exposed portion 8 (the influence of the filler or the adhesion state of the first passivation film 5 and the plating layer 7), this embodiment is not affected by these causes and can be broadly applied to a semiconductor device where the exposed portion 8 occurs eventually and its manufacturing method.

Although this embodiment is described as applied to the semiconductor device formed with the ball-shaped terminal 11, the structure of the embodiment can be applied to the semiconductor device without the ball-shaped terminal, for example, to a LGA (Land Grid Array) type semiconductor device.

What is claimed is:

1. A semiconductor device comprising:
   a semiconductor substrate;
   a pad electrode disposed on the substrate;
   a first passivation film disposed on the substrate and having a first opening above the pad electrode so that an edge portion of the pad electrode is covered by the first passivation film;
   a plating layer disposed on the pad electrode in the first opening;
   a second passivation film disposed on the plating layer and the first passivation film and having a second opening above the plating layer, the second passivation film filling a gap between an edge portion of the plating layer and an edge portion of the first passivation film so as to contact the pad electrode; and a conductive terminal disposed on the plating layer in the second opening, wherein the first passivation film comprises an organic material, the edge portion of the plating layer farthest from the conductive terminal is in direct contact with the pad electrode, and the conductive terminal is disposed in the second opening of the second passivation film so that there is a separation in the second opening between the conductive terminal and the second passivation film.

2. A method of manufacturing a semiconductor device, comprising:

providing a semiconductor substrate comprising a pad electrode disposed thereon;

forming on the substrate a first passivation film covering an edge portion of the pad electrode so as to form a first opening above the pad electrode;

forming a plating layer on the pad electrode in the first opening;

forming a second passivation film on the plating layer and the first passivation film so as to form a second opening above the plating layer and to fill a gap between an edge portion of the plating layer and an edge portion of the first passivation film so that the second passivation film is in contact with the pad electrode through the gap; and forming a conductive terminal on the plating layer in the second opening, wherein the first passivation film comprises an organic material, the plating layer is formed so that the edge portion of the plating layer farthest from the conductive terminal is in direct contact with the pad electrode, and the conductive terminal is formed in the second opening of the second passivation film so that there is a separation in the second opening between the conductive terminal and the second passivation film.

3. A semiconductor device comprising:

a semiconductor substrate;

a pad electrode disposed on the substrate;

a first passivation film made of an organic material and disposed on the substrate and having a first opening above the pad electrode so that an edge portion of the pad electrode is covered by the first passivation film;

a plating layer disposed on the pad electrode in the first opening so as not be in contact with the first passivation film;

a second passivation film disposed on the plating layer and the first passivation film and having a second opening above the plating layer, the second passivation film filling a gap between an edge portion of the plating layer and an edge portion of the first passivation film; and a conductive terminal disposed on the plating layer in the second opening, wherein the edge portion of the plating layer farthest from the conductive terminal is in direct contact with the pad electrode, and the conductive terminal is disposed in the second opening of the second passivation film so that there is a separation in the second opening between the conductive terminal and the second passivation film.

4. A semiconductor device comprising:

a semiconductor substrate;

a pad electrode disposed on the substrate;

a first passivation film disposed on the substrate and having a first opening above the pad electrode so that an edge portion of the pad electrode is covered by the first passivation film;

a plating layer disposed on the pad electrode in the first opening;

a second passivation film disposed on the plating layer and the first passivation film and having a second opening above the plating layer, the second passivation film filling a gap between an edge portion of the plating layer and an edge portion of the first passivation film so as to contact the pad electrode; and a conductive terminal disposed on the plating layer in the second opening, wherein the first passivation film comprises an organic material, and the conductive terminal is disposed in the second opening of the second passivation film so that there is a separation in a direction parallel to the semiconductor substrate between the conductive terminal and the second passivation film.

* * * * *